(12) United States Patent
Griswold et al.

(10) Patent No.: US 7,671,595 B2
(45) Date of Patent: Mar. 2, 2010

(54) ON-COIL SWITCHED MODE AMPLIFIER FOR PARALLEL TRANSMISSION IN MRI

(75) Inventors: Mark A. Griswold, Shaker Heights, OH (US); Jeremiah A. Heilman, University Heights, OH (US); Matthew J. Riffe, Cleveland Heights, OH (US); Oliver Heid, Gunzenhausen (DE); Markus Vester, Nuremberg (DE)

(73) Assignee: Case Western Reserve University, Cleveland, OH (US)

( * ) Notice: Subject to any disclaimer, the term of this patent is extended or adjusted under 35 U.S.C. 154(b) by 161 days.

(21) Appl. No.: 12/074,892

(22) Filed: Mar. 7, 2008

(65) Prior Publication Data

US 2008/0231282 A1 Sep. 25, 2008

Related U.S. Application Data

(60) Provisional application No. 60/919,449, filed on Mar. 22, 2007.

(51) Int. Cl.
*G01V 3/001* (2006.01)
(52) U.S. Cl. .................... 324/322; 324/318
(58) Field of Classification Search ......... 324/300–322; 600/407–435
See application file for complete search history.

(56) References Cited

U.S. PATENT DOCUMENTS 5,433,196 A * 7/1995 Fiat .................. 600/410
5,682,883 A * 11/1997 Fiat .................. 600/323
2009/0134876 A1* 5/2009 Griswold et al. ......... 324/318

OTHER PUBLICATIONS

Sabate et al: High-power high-fidelity switching amplifier driving gradient coils for MRI systems; Power Electronics Specialists Conference PESC 04, 2004 IEEE 35th Annual Publication, pp. 261-266, Jun. 20-25, 2004.*
Sabate et al: Parallel operation of switching amplifiers driving magnetic resonance imaging gradient coils; Power Electronics and Motion Control Conference 2004, IPEMC The 4th International Publication, pp. 1563-1567, Date Aug. 14-16, 2004.*
Watanabe et al: DPS-based high precision current tracking control of gradient coil in two paralled PWM amplifiers for MRI systems; Power Electronics Speciliasts Conference, 1998 PESE 98 Record 29th Annual IEEE Publication, pp. 916-921, date May 17-22, 1998.*

* cited by examiner

*Primary Examiner*—Brij B Shrivastav
(74) *Attorney, Agent, or Firm*—Kraguljac & Kalnay, LLC

(57) ABSTRACT

Example systems, apparatus, circuits, and so on described herein concern parallel transmission in MRI. One example apparatus includes at least two field effect transistors (FETs) that are connected by a coil that includes an LC (inductance-capacitance) leg. The apparatus includes a controller that inputs a digital signal to the FETs to control the production of an output analog radio frequency (RF) signal. The LC leg is to selectively alter the output analog RF signal and the analog RF signal is used in parallel magnetic resonance imaging (MRI) transmission.

19 Claims, 13 Drawing Sheets

ON-COIL SWITCHED MODE AMPLIFIER FOR PARALLEL TRANSMISSION IN MRI

PRIORITY CLAIM

This application claims the benefit of U.S. Provisional Patent Application 60/919,449, titled "On-Coil Switched Mode Amplifier For Parallel Transmission in MRI", filed Mar. 22, 2007, and claims the benefit of U.S. Provisional Patent Application 60/905,941, titled "On-Coil Switched Mode Amplifier For Parallel Transmission in MRI", filed Mar. 9, 2007.

COPYRIGHT NOTICE

A portion of the disclosure of this patent document contains material subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Magnetic resonance imaging (MRI) involves the transmission of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Using multiple receivers facilitates speeding up signal reception, which in turn may reduce scan time. Similarly, multiple transmitters may be used in parallel transmission techniques. Using multiple transmitters may facilitate speeding up a transmission process, which in turn may facilitate volumetric excitation, selective isolation, and other very high speed features. However, conventional parallel transmission techniques have encountered issues with scaling, fidelity, and synchronization.

Conventional systems may have attempted to parallelize their existing RF transmitters. Thus, conventional systems may have relied on multiple, individually powered, single channel, analog-in-analog-out RF transmitters for parallel transmission. These systems tended not to scale well due to cabling duplication, power transmitter duplication, control duplication, and other issues. Even when a small number (e.g., 4) of transmitters were employed, these systems may not have produced desired fidelity. For example, conventional systems may have had complicated power distribution management and may have been difficult to synchronize. Additionally, conventional systems typically had poor isolation between coils, resulting in degraded performance. Furthermore, these systems may have required each element in an array to be tuned and matched, which is a very time-consuming procedure.

Conventional systems may also have been limited by their use of relatively low power (e.g., <50 W), low efficiency class A or class AB amplifiers. While some systems may have included on-coil series and/or shunt-fed class-D amplifiers, even these conventional systems have suffered from several limitations including inadequate detuning and low efficiency. Proposed systems that indicate that they may achieve higher efficiency still appear to lack adequate control mechanisms. Due, at least in part, to these limitations, conventional systems may not have produced desired levels of amplitude and/or phase control and thus may have had less than desirable fidelity.

BRIEF DESCRIPTION OF THE DRAWINGS

The accompanying drawings, which are incorporated in and constitute a part of the specification, illustrate various example systems, methods, and other embodiments of various aspects of the invention. It will be appreciated that the illustrated element boundaries (e.g., boxes, groups of boxes, or other shapes) in the figures represent one example of the boundaries. One of ordinary skill in the art will appreciate that in some embodiments one element may be designed as multiple elements, multiple elements may be designed as one element, an element shown as an internal component of another element may be implemented as an external component and vice versa, and so on. Furthermore, elements may not be drawn to scale.

Prior Art

Prior Art

Prior Art

DETAILED DESCRIPTION

Figure 1:
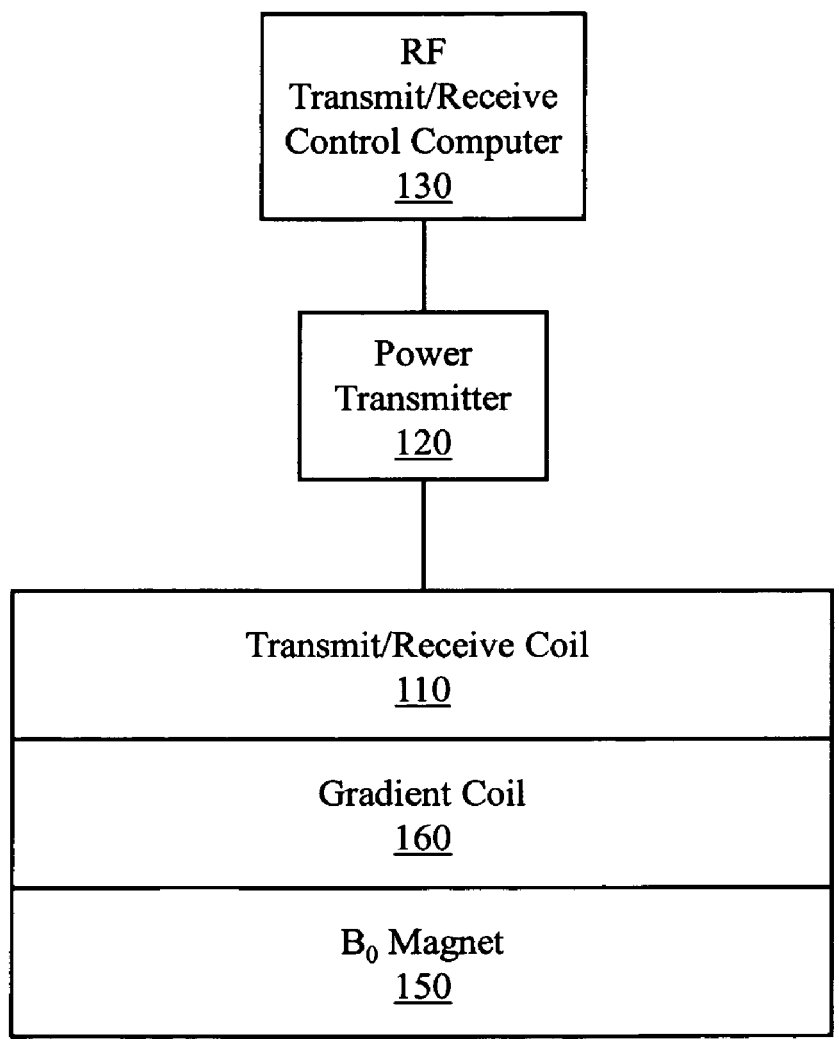
FIG. 1 illustrates portions of a conventional non-parallel MRI apparatus.

Prior Art FIG. 1 illustrates a conventional system that used a single transmit coil and a single receive coil. This conventional system could not perform parallel acquisition or transmission. This system presented the transmit coil 110 with an analog signal and the transmit coil 110 produced an analog output signal. The transmit coil 110 was powered by a single power transmitter 120 that may have been controlled by a computer 130. The system would also have included other standard MRI apparatus components (e.g., main field magnet 150, gradient coils 160, etc.) Thus, prior art FIG. 1 represents a class of devices characterized by a single power transmitter coupled to a single transmit receive coil that produced an analog signal and received an analog signal. The receiving was not in parallel.

Figure 2:
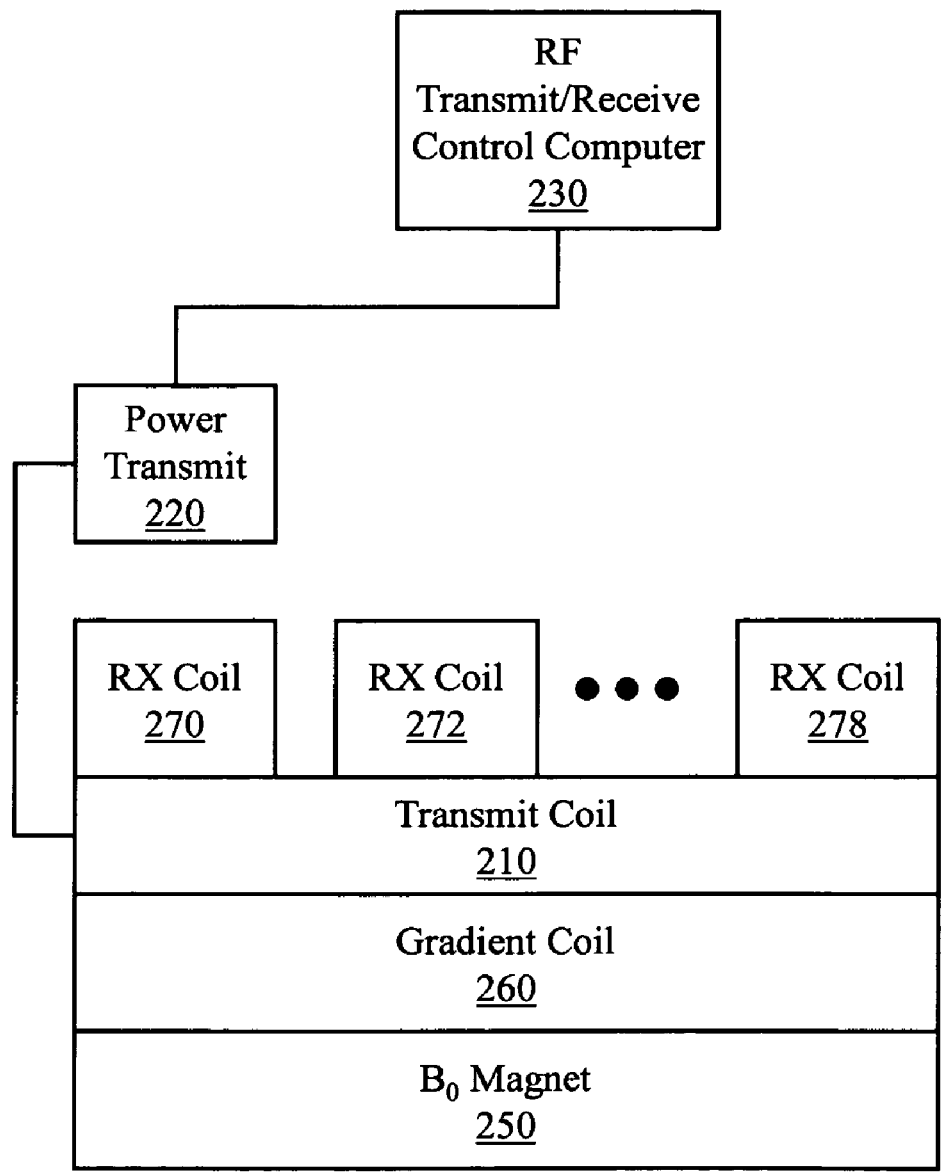
FIG. 2 illustrates portions of a conventional parallel MRI apparatus.

Prior Art FIG. 2 illustrates a conventional system that used a single transmit coil 210 and multiple receive coils (e.g., 270, 272 . . . 278). This conventional system could perform parallel acquisition but could not perform parallel transmission. This system presented the transmit coil 210 with an analog signal and the transmit coil 210 produced an analog output signal. The transmit coil 210 was powered by a single transmitter 220 that may have been controlled by a computer 230. Once again the system would also have included other components (e.g., main field magnet 250, gradient coil 260, ...). The system could perform parallel acquisition because it included receive coils 270 and 272 through 278. Thus, prior art FIG. 2 represents a class of devices characterized by a single power transmitter coupled to a single transmit coil that produced an analog signal and received, in parallel, an analog signal.

Figure 3:
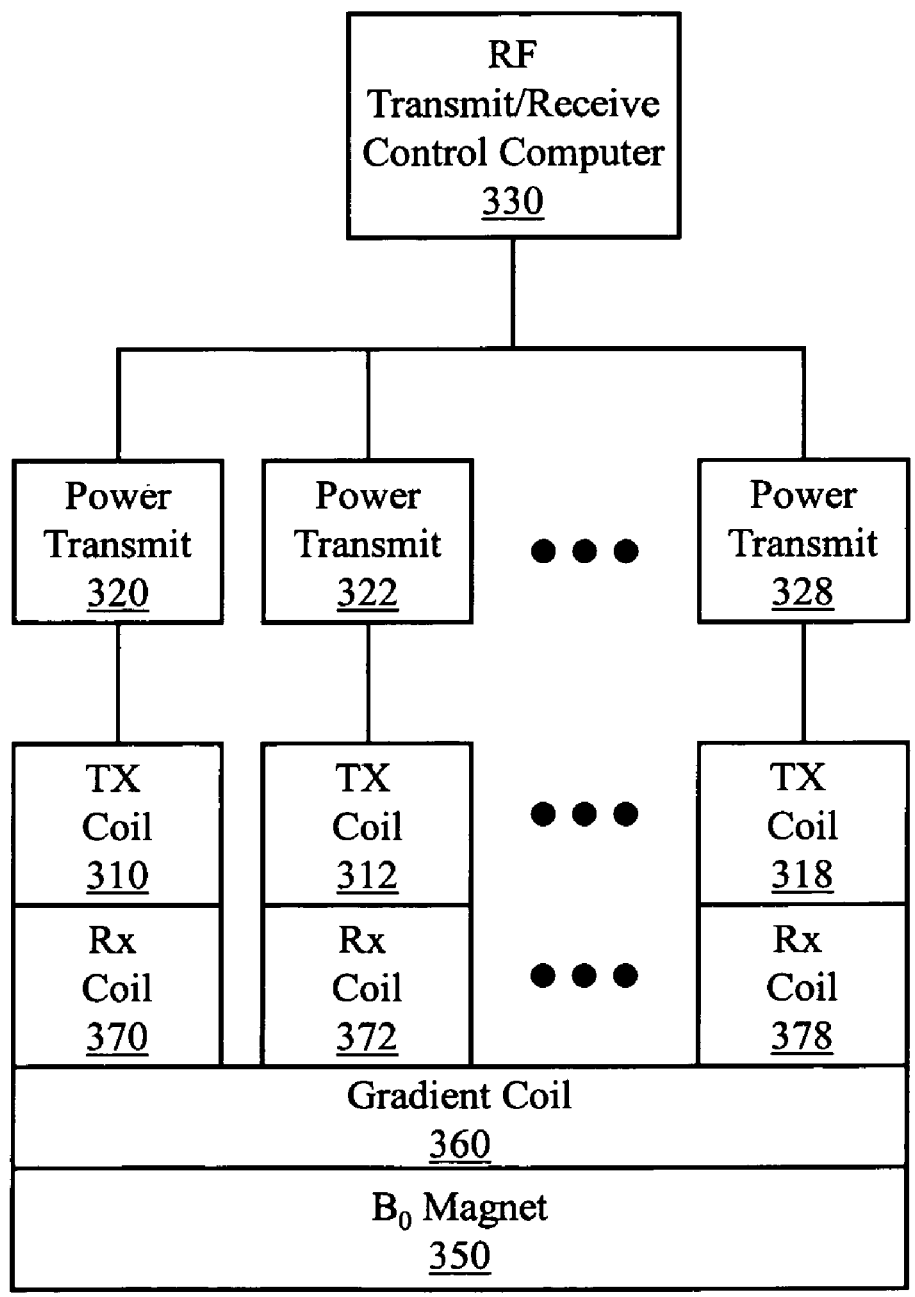
FIG. 3 illustrates portions of a conventional parallel MRI apparatus.

Prior Art FIG. 3 illustrates a conventional system that used multiple independent external transmitters (e.g., 320, 322 ... 328), multiple transmit coils (e.g., 310, 312 ... 318) and multiple receive coils (e.g., 370, 372 ... 378). Once again the system would also have included other components (e.g., main field magnet 350, gradient coil 360, and so on). This conventional system could perform both parallel acquisition and parallel transmission. However, this system may have suffered from the limitations described above including, for example, scaling, synchronization, interference between coils, and so on. The system presented each transmit coil with an analog signal and each transmit coil produced an analog signal. Each transmit coil was powered by a separate power transmitter and was connected to its power transmitter by a separate coaxial cable. The power transmitters may have been controlled by a computer 330. Thus, the system illustrated in FIG. 3 did not scale well due to power transmitter proliferation, tuning and matching requirements, cable proliferation and coupling, and power consumption increases. The sheer volume of the multiple power transmitters and multiple cables made physical design difficult. The power required to drive all the transmitters and the resulting heat produced by all these transmitters created additional design issues. Furthermore, cable paths and coil design may have produced cross talk issues, interference issues, and so on. Furthermore, synchronization of the transmit coils was difficult, if possible, to achieve, and even included cable length and connection engineering issues.

Figure 4:
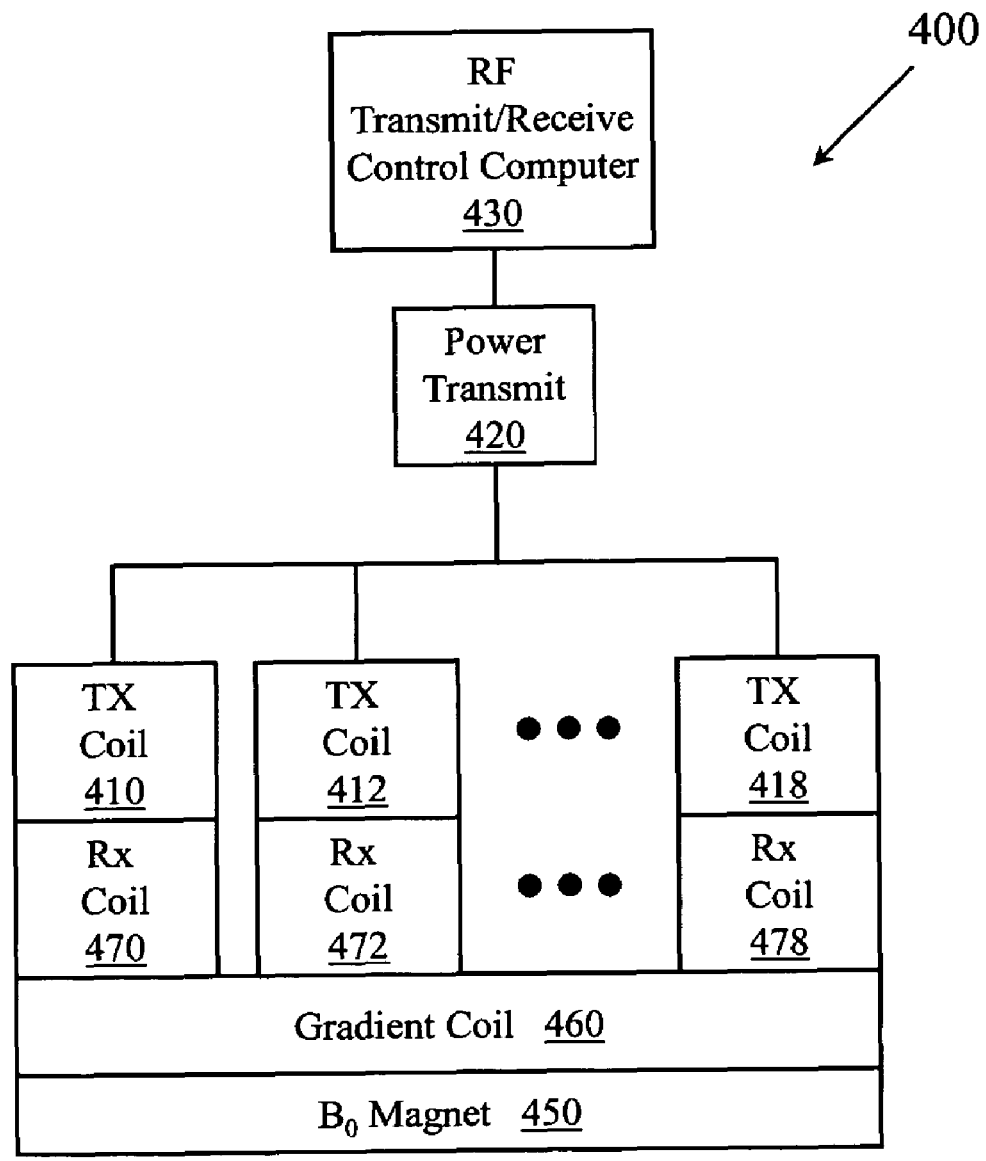
FIG. 4 illustrates portions of a parallel MRI apparatus configured with an on-coil switched mode amplifier.
Figure 12:
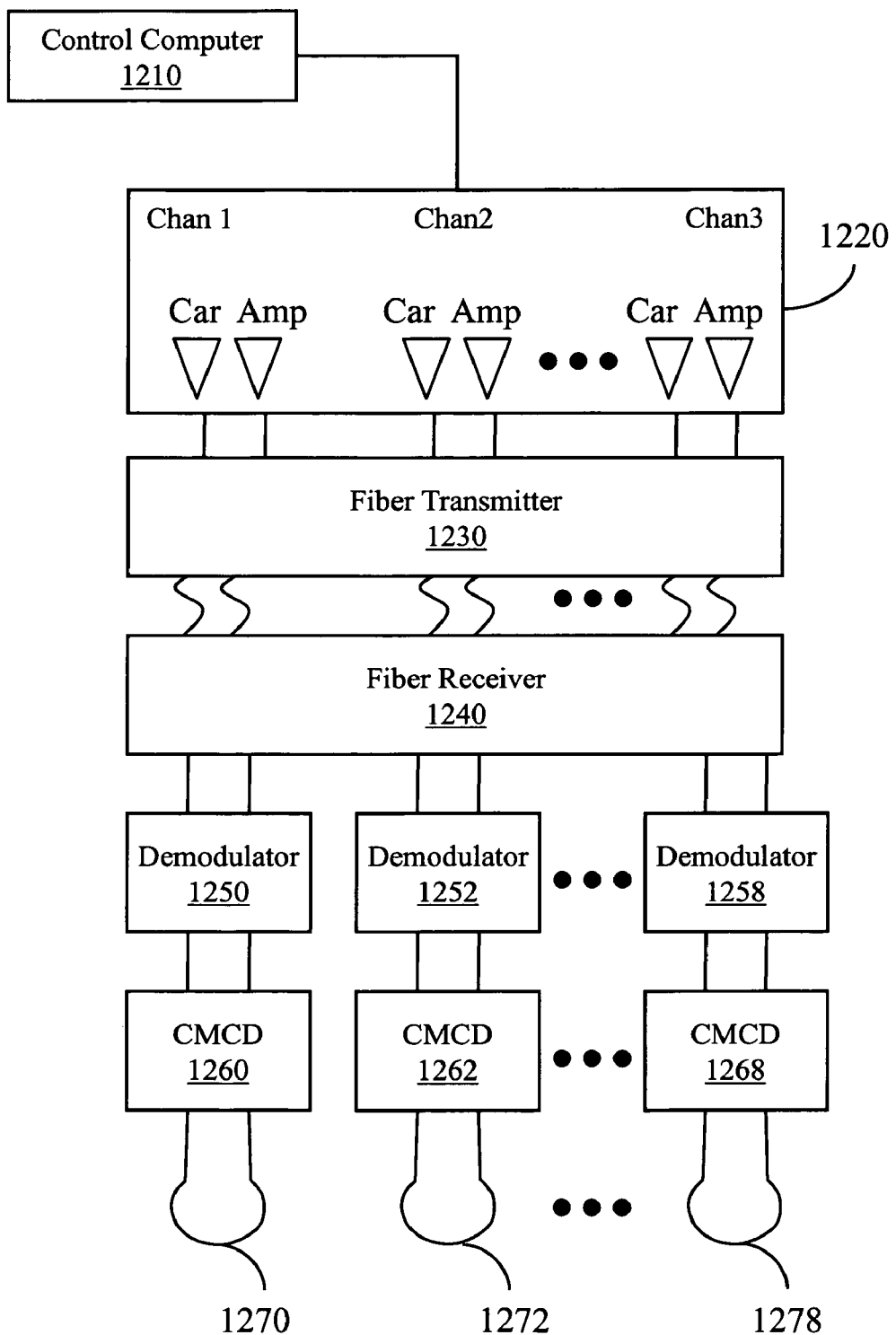
FIG. 12 illustrates multiple CMCDs being employed in a multi-channel environment.

FIG. 4 illustrates an example system 400 that uses multiple independent transmit coils (e.g., 410, 412 ... 418) and multiple receive coils (e.g., 470, 472 ... 478). The transmit coils have on-coil switched mode amplifiers that facilitate improved parallel transmission in MRI. In one example, an "on-coil" amplifier is an amplifier that performs within the bore of a magnet in an MRI apparatus. One skilled in the art will appreciate that MRI apparatus are generally enclosed in a bounding Faraday cage. In another example, an "on-coil" amplifier is an amplifier that performs near the bore of the magnet, yet still within the volume of space enclosed by a bounding Faraday cage. In yet another example, an "on-coil" amplifier is an amplifier that performs less than one wavelength of the amplifier from the transmit coil. The transmit coils may be powered by digital controllers 420 (e.g., power transmitters 420) that are controlled by a computer 430. Thus, synchronization may be improved over conventional systems. Additionally, the transmit coils can be connected to the digital controllers by a dedicated connection (e.g., copper cable, fiber optic cable, wireless connection). Using a connection other than copper cable may facilitate mitigating interference issues, cross talk issues, physical space requirement issues (e.g., cable space, transmitter space), and so on. FIG. 12 illustrates fiber connections. Using a single digital controller 420 may also reduce issues associated with physical layout, synchronization, heating, and cooling. The electronic components (e.g., FETs) in the on-coil switched-mode amplifier facilitate controlling the coils with a digital signal. Thus, the transmit coils may receive a digital signal and produce an analog signal having improved characteristics.

Once again the system would also include other standard MRI apparatus elements (e.g., main field magnet 450, gradient coils 460, and so on).

Figure 5:
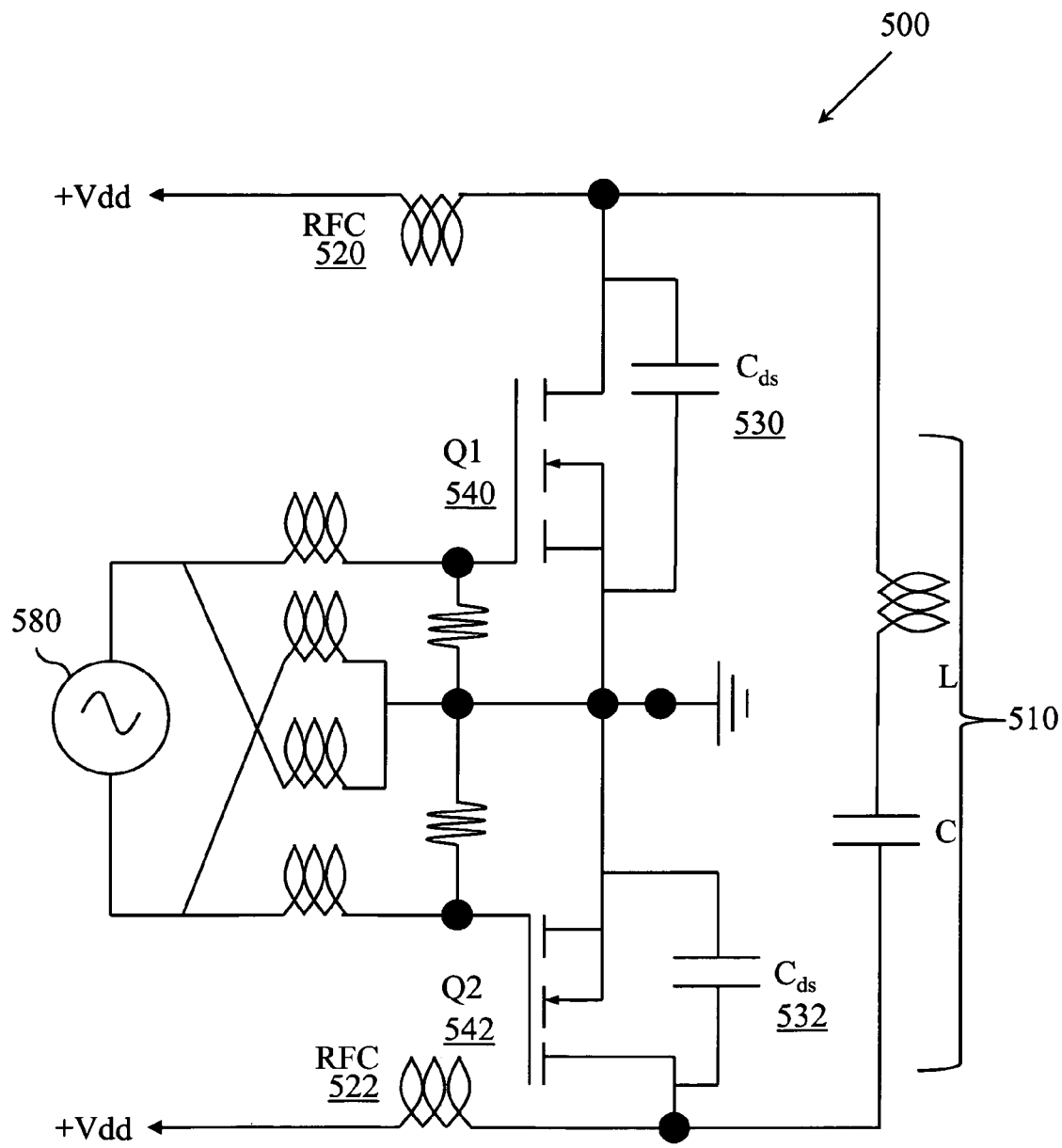
FIG. 5 illustrates a current-mode class-D amplifier topology for use in parallel MRI transmission involving on-coil switched-mode amplification.

FIG. 5 illustrates an example current-mode class-D amplifier topology 500. This topology may be referred to collectively as a CMCD amplifier. A coil configured with this topology may be referred to as an L-C-switched-mode coil. In the illustration, the coil is represented by the series LC leg 510. The L refers to inductance in the coil 510 and the C refers to capacitance in the coil 510. The two chokes RFC (e.g., 520, 522) act as current sources. The drain-source capacitances $C_{ds}$ (e.g., 530, 532) are in series with the coil 510. Alternative shunting of an applied DC voltage to ground as an FET is driven to saturation produces excitation at desired RF frequencies. In one example, element 580 corresponds to an RF transmission unit 1060 in FIG. 10. While LC Leg 510 is illustrated in one configuration in FIG. 5, it is to be appreciated that an LC leg may have different filter configurations and may include both parallel and serial components as well as combinations thereof.

Figure 8:
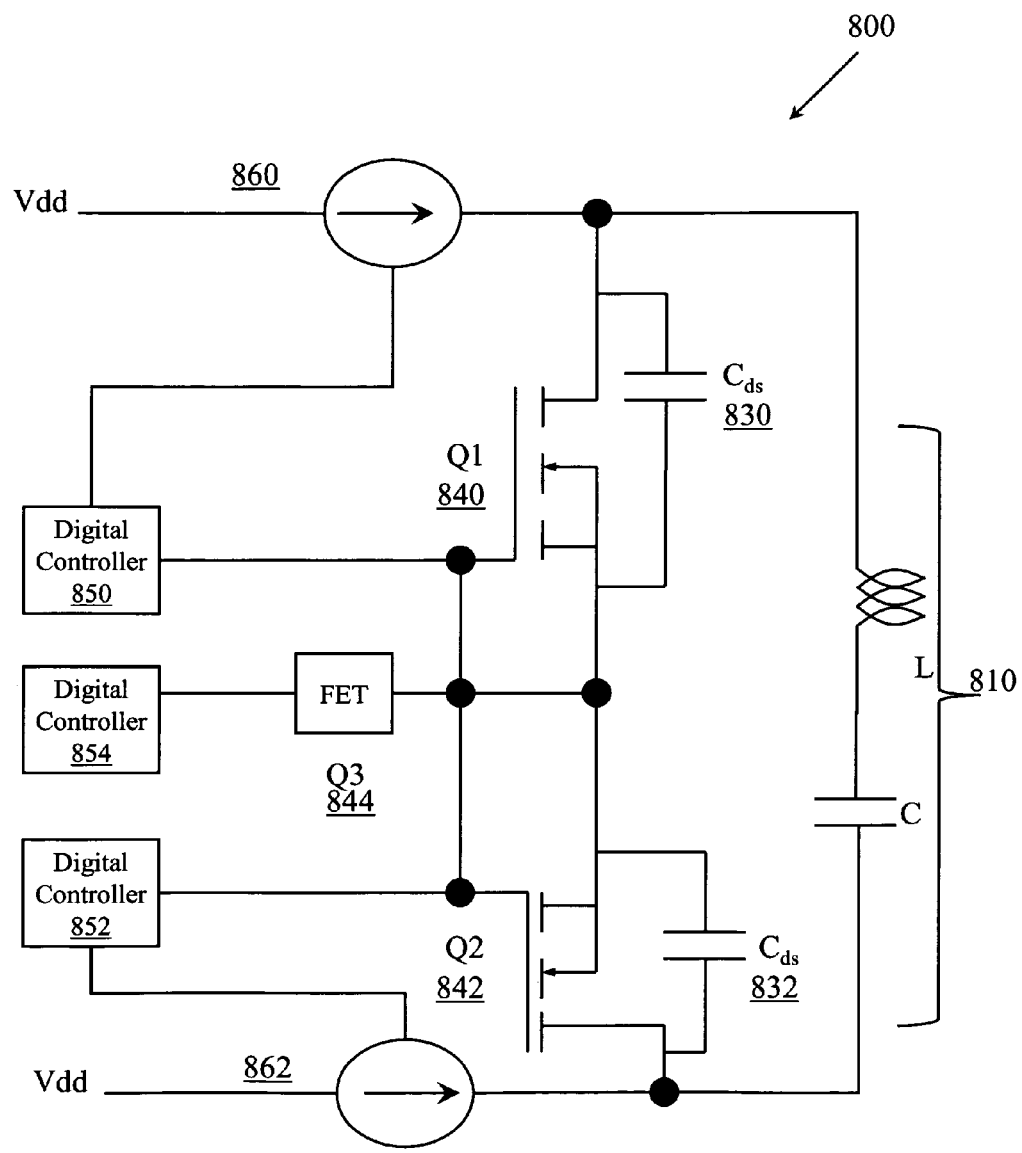
FIG. 8 illustrates a topology in which an additional FET has been added.

The example CMDC design may be implemented on an array of surface coils of various sizes (e.g., 8.5 cm×8.5 cm). The coils may include various shielding configurations (e.g., 12.5 cm×12.5 cm). The coils may be tuned to different field strengths (e.g., 1.5T). Note that the coil 510 terminals are attached between the drains of the two FETs (Q1 540, Q2 542) and tuned so that the circuit is series resonant when one of the FETs is switched on. In one example, both FETs may be driven out of phase to optimize efficiency. While two FETs (Q1 540, Q2 542) are illustrated, it is to be appreciated that two or more FETs may be employed. See, for example, system 800 (FIG. 8).

In one example, pulsed power outputs over 1000 W may be produced using the topology illustrated in FIG. 5. These outputs may be produced with amplifier efficiencies in the 85% range. In one example, upper harmonic suppression greater than 40 dB may be achieved. Isolation between adjacent, non-overlapping coils may be achieved. In one example, isolation of 20 dB due to coil detuning in the off state may be achieved. Furthermore, 20 dB of isolation between adjacent, non-overlapping resonant coils may be achieved based on controlling the amplifier impedance.

Example systems improve on conventional apparatus by using a high-power amplifier topology for parallel transmission using on-coil field effect transistors (FETs) that can be driven by low power (e.g., 5V) signals. One example system (e.g., FIG. 5) uses a current-mode class-D (CMDC) amplifier topology. CMCD amplifiers may produce higher efficiency at higher output power than class-D or class-E amplifiers. The higher efficiency at higher output power is related to the series incorporation of FET drain source capacitance $C_{ds}$ in a coil loop, which facilitates zero voltage switching. The coil transmit current may be uniquely controlled by the gate voltage. Since the load may be driven directly by the amplifier (e.g., does not require tuning and matching to a 50 ohm network), the amplifier is referred to as a "current mode" amplifier. Since the current in the transmit coil is uniquely determined by the gate voltage, this suppresses any coupled currents from other transmit coils.

The symmetry of the configuration illustrated in FIG. 5 additionally suppresses the effects of coupled currents. When both FETs are off, coils are automatically detuned. The coils are detuned because both $C_{ds}$ are in series. In one example, concentric shielding can be used to reduce electric field coupling. This facilitates reducing drain bias disturbances. These two factors combine to improve isolation over conventional approaches.

Figure 6:
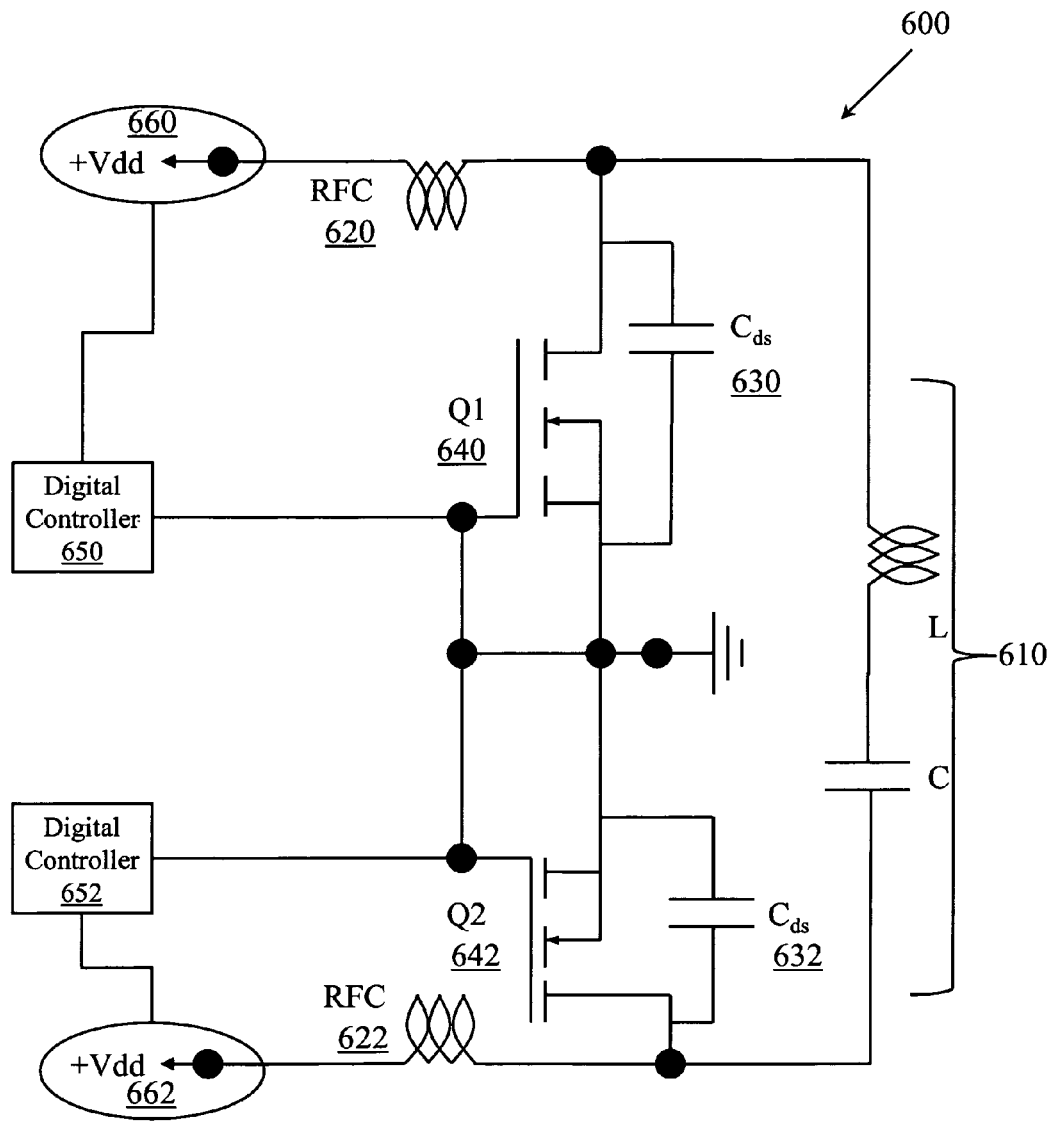
FIG. 6 illustrates a topology in which voltage and/or current sources are additionally and/or alternatively digitally controllable.
Figure 7:
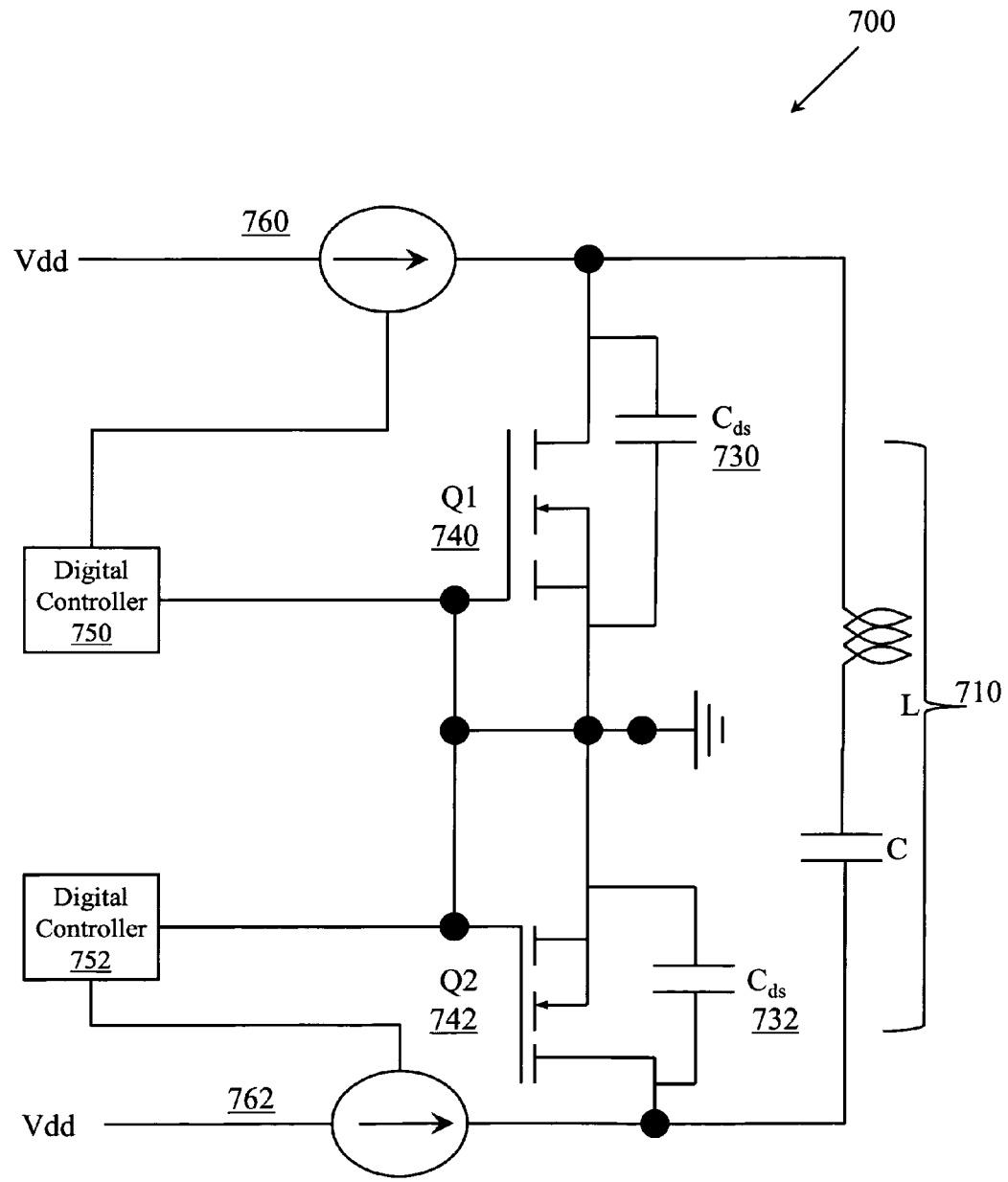
FIG. 7 illustrates a topology in which current sources are additionally and/or alternatively digitally controllable.

It is to be appreciated that FIG. 5 is one example topology. FIGS. 6, 7, and 8 illustrate different examples and illustrate the additional and/or alternative digital control of current sources and/or supplies. These figures generally describe a current-mode, class-D amplifier situated on a coil. Since the amplifier is located on the coil, frequency matching is not required. This facilitates performing a one-time load-independent match for the amplifier. Since the amplifier is a class-D amplifier, a digital input can be employed.

Consider FIG. 6, which illustrates a topology 600 in which voltage and/or current sources are additionally and/or alternatively digitally controllable. Topology 600 may be arranged, for example, as a circuit. FIG. 6 includes several elements similar to those described in connection with topology 500 (FIG. 5). For example, topology 600 includes an L-C leg 610, two current sources 620 and 622, two drain-source capacitances 630 and 632, and two FETs 640 and 642. In addition to the digital control in FIG. 5, FIG. 6 illustrates a digital controller 650 and a digital controller 652. These digital controllers provide digital control of the {+Vdd, RFC} elements 660 and 662. This digital control facilitates improving amplitude modulation accuracy and ease of use.

More generally, FIG. 6 illustrates an apparatus having at least two FETs (e.g., 640, 642) connected by a coil 610 including an LC leg. The apparatus include a controller (e.g., 650, 652) to input a digital signal to the at least two FETs (e.g., 640, 642) and to control the production of an output analog radio frequency (RF) signal, based, at least in part, on the digital signal. The LC leg 610 is to selectively alter the output analog RF signal. The output analog RF signal is associated with parallel MRI transmission. The apparatus also includes at least two drain-source capacitances (e.g., 630, 632) in series with the coil 610. In one example, the digital control signal provided by digital controller 650 and/or 652 may be determinable from the desired analog RF signal by sigma delta modulation, pulse width modulation, pulse train optimization, and so on. In one example, the digital control signal may a voltage in the range of 0.1V to 50V and the output analog RF signal may have a power in the range of 1 W to 3000 W.

In one example, the digital controllers 650 and 652 are connected to the at least two FETs (e.g., 640, 642) by a dedicated connection. The dedicated connection may be, for example, a wireless connection, a fiber optic connection, and so on. While FIG. 6 illustrates a single apparatus 600, it is to be appreciated that multiple instances of the apparatus 600 may be implemented on an array of surface coils. These surface coils may be tuned to different field strengths and may include a shielding element.

FIG. 7 illustrates a topology 700 in which current sources are additionally and/or alternatively digitally controllable. Topology 700 may be arranged, for example, as a circuit. FIG. 7 includes several elements similar to those described in connection with topology 600 (FIG. 6). For example, topology 700 includes an L-C leg 710, two current sources 720 and 722, two drain-source capacitances 730 and 732, two FETs 740 and 742, and two digital controllers 750 and 752. Note that the {+Vdd, RFC} elements 660 and 662 (FIG. 6) have been replaced with more generic current sources 760 and 762, which are digitally controlled by digital controllers 750 and 752 respectively. Once again this digital control facilitates improving amplitude modulation accuracy and ease of use.

FIG. 8 illustrates a topology 800 in which an additional FET Q3 844 and an additional corresponding digital controller 854 have been added to the topology 700 illustrated in FIG. 7. Topology 800 may be arranged, for example, as a circuit. FET Q3 844 is illustrated using a labeled box rather than a conventional circuit drawing element. This is to point out that "FET", as used herein, is used as a generic term and may refer to class of switching elements that may include, for example, FETs (field effect transistor), BJTs (bipolar junction transistor), JFETs (junction FET), and so on. Thus, in different embodiments of the apparatus and circuits described herein, different switching elements may be employed. FIG. 8 includes several elements similar to those described in connection with topology 700 (FIG. 7). For example, topology 800 includes an L-C leg 810, current sources 820 and 822, drain-source capacitances 830 and 832, FETs 840 and 842 (along with additional FET 844), digital controllers 850 and 852 (along with additional digital controller 854), and current sources 860 and 862.

Figure 9:
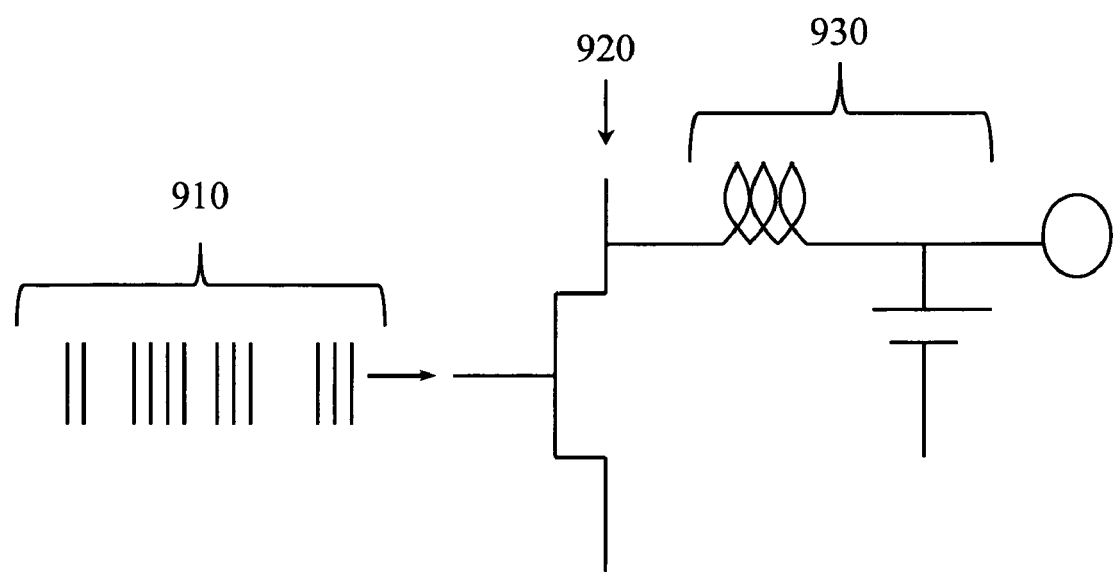
FIG. 9 illustrates an input bit pattern being provided to a FET and filter.

FIG. 9 illustrates a digital bit pattern 910 being provided to an FET 920 and then to a filter 930. This illustrates that an L-C-switched-mode coil may perform both switching and filtering. The filtering may be customized by the inductance and capacitance in the coil (LC leg 510 in FIG. 5). In one example, an input bit pattern can be computed for a desired output RF signal using techniques including sigma-delta modulation, pulse width modulation, pulse train optimization, and so on. For example, the desired output voltage may be known, and the bit pattern that produces that output voltage can be determined using sigma delta modulation. In one example of the conventional system illustrated in FIG. 3, a single pattern may be made available to all the switched mode amplifiers on all the transmit coils. Thus, in one example, one and only one bit pattern will be available to all the coils.

To improve individual control, the topology 500 illustrated in FIG. 5, being implemented in individual coils in the system illustrated in FIG. 4, may receive individual bit patterns like those illustrated in FIG. 9. Thus, individual coils may be individually controlled. Thus, the on-coil field effect transistors can be individually controlled to create a desired portion of the total power that a coil is to contribute during parallel transmission in MRI. Furthermore, with the individual control available, different coil configurations (e.g., symmetrical) may provide sufficient degrees of freedom to produce a signal(s) of arbitrary amplitude and phase. This improved control over amplitude and phase may result in higher fidelity, providing improvements over conventional systems. In one example, the bit pattern may be provided by an external source (e.g., computer). In another example, bit patterns may be stored in a memory local to the coil apparatus. Thus, a simple bit pattern identifier may be provided from an external source, reducing the communication requirements with that external source and potentially increasing the ability to more quickly switch between RF signals being produced.

Figure 10:
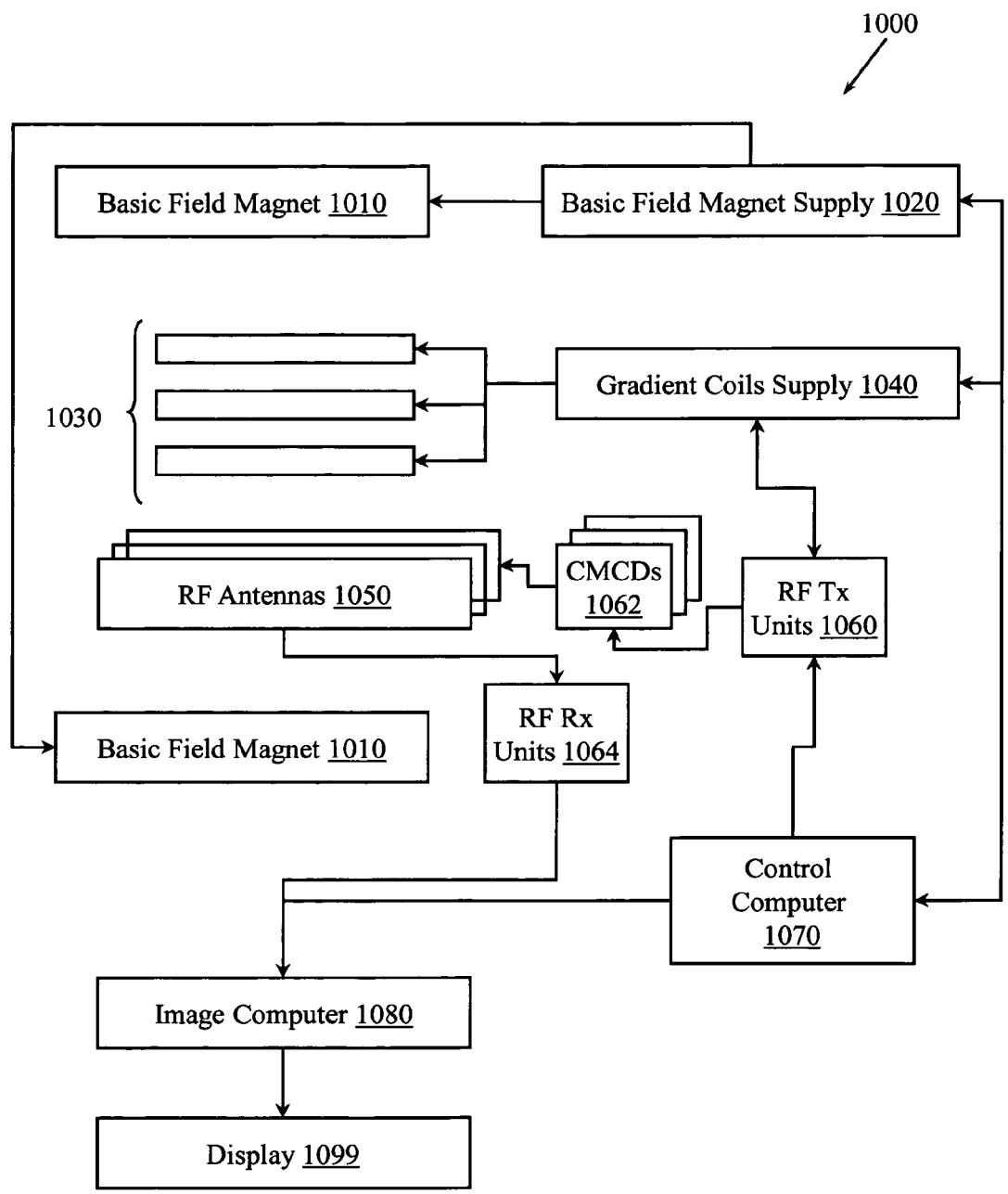
FIG. 10 illustrates an MRI apparatus configured with an on-coil switched mode amplifier.

FIG. 10 illustrates an example MRI apparatus 1000 configured with a set of on-coil switched mode amplifiers to facilitate improved parallel transmission of analog RF signals used in MRI. The on-coil switched mode amplifiers may be configured like those illustrated in FIGS. 5 through 8 and in FIG. 11. Consider a relationship between elements in FIG. 5 and elements in FIG. 10. The RF antennas 1050 may correspond in part to element 510 (FIG. 5). The CMCDs 1062 may correspond in part to topology 500, minus elements 510 and 580. The RF transmission (TX) units 1060 may correspond to element 580. Similar correlations may be made between elements in FIGS. 6-8 and FIG. 11.

The apparatus 1000 includes a basic field magnet(s) 1010 and a basic field magnet supply 1020. Ideally, the basic field magnets 1010 would produce a uniform $B_0$ field. However, in practice, the Bo field may not be uniform, and may vary over an object being imaged by the MRI apparatus 1000. MRI apparatus 1000 may include gradient coils 1030 configured to emit gradient magnetic fields like $G_s$, $G_p$ and $G_R$. The gradient coils 1030 may be controlled, at least in part, by a gradient coils supply 1040. In some examples, the timing, strength, and orientation of the gradient magnetic fields may be controlled, and thus selectively adapted during an MRI procedure.

MRI apparatus 1000 may include a set of RF antennas 1050 that are configured to generate RF pulses and to receive resulting magnetic resonance signals from an object to which the RF pulses are directed. In one example, the RF antennas 1050 may be considered to correspond, at least in part, to element 510 (FIG. 5). In some examples, how the pulses are generated and how the resulting MR signals are received may be controlled and thus may be selectively adapted during an MRI procedure. Separate RF transmission and reception coils can be employed. The RF antennas 1050 may be controlled, at least in part, by a set of RF transmission units 1060. An RF transmission unit 1060 may provide a signal to a CMCD 1062, which may manipulate the signal and provide a different signal to an RF antenna 1050. The signal may be manipulated (e.g., amplified) according to approaches described above in connection with FIGS. 5-8 and in FIG. 11.

The gradient coils supply 1040 and the RF transmission units 1060 may be controlled, at least in part, by a control computer 1070. In one example, the control computer 1070 may be programmed to perform methods like those described herein. The magnetic resonance signals received from the RF antennas 1050 can be employed to generate an image, and thus may be subject to a transformation process like a two dimensional FFT that generates pixilated image data. The transformation can be performed by an image computer 1080 or other similar processing device. The image data may then be shown on a display 1099. While FIG. 10 illustrates an example MRI apparatus 1000 that includes various components connected in various ways, it is to be appreciated that other MRI apparatus may include other components connected in other ways.

In one example, MRI apparatus 1000 may include control computer 1070 and a digital controller operably connected to the CMCDs 1060. The CMCDs 1060 may include a set of L-C-switched-mode coils operably connected to the digital controller. In one example, a member of the set of L-C-switched-mode coils may be individually controllable by the control computer 1070. Additionally, the control computer 1070 may provide an L-C-switched-mode coil with a digital control signal and the L-C-switched-mode coil may output an analog RF signal based, at least in part, on the digital control signal.

In one example, the set of L-C-switched mode coils may be operably connected to the control computer 1070 by dedicated connections. The dedicated connections may include be a copper cable, a fiber optic cable, a wireless connection, and so on. In one example, the L-C-switched-mode coil may be operably connected to a local memory that stores bit patterns that control production of the analog RF signal. Thus, the digital control signal may identify a stored bit pattern.

Figure 11:
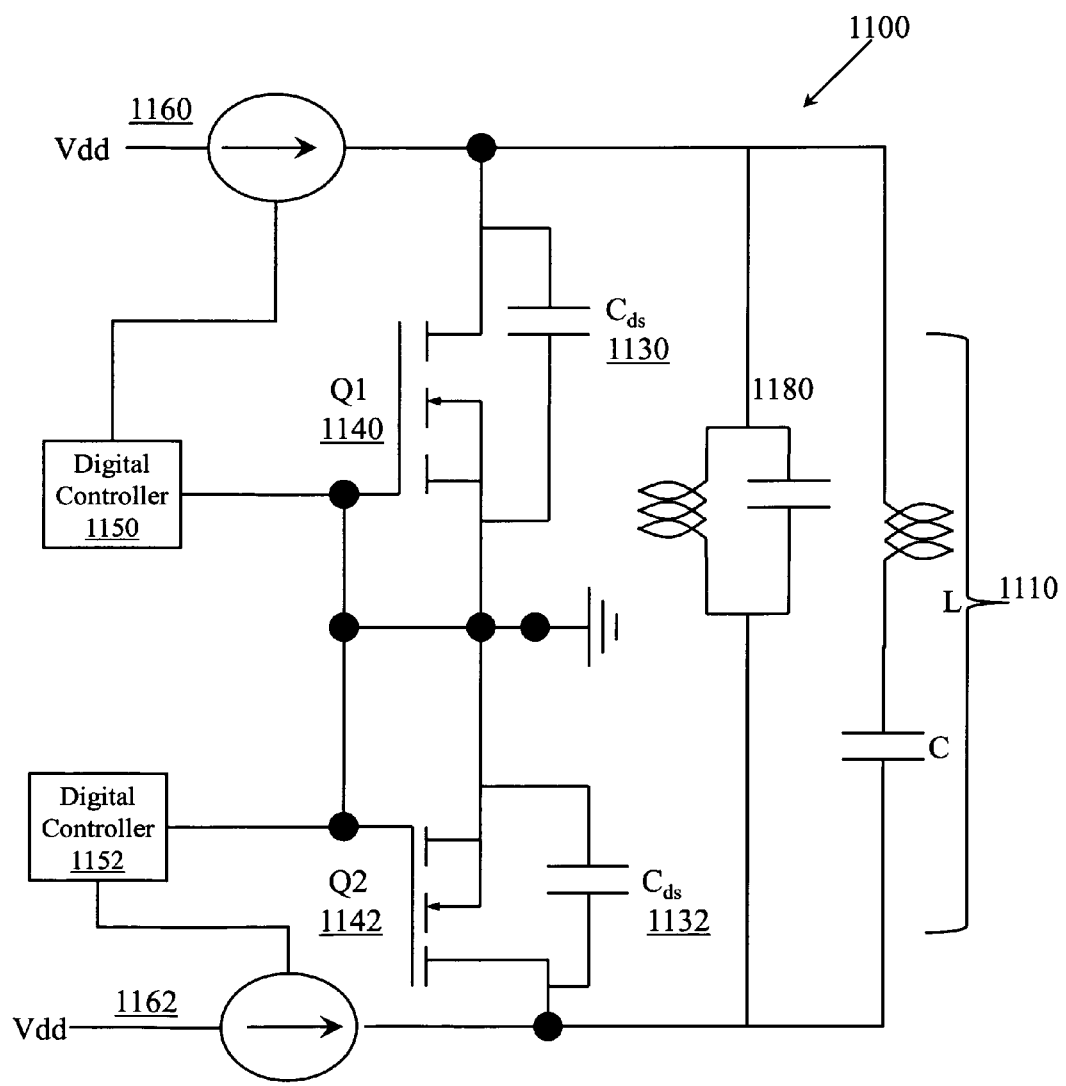
FIG. 11 illustrates a current-mode class-D amplifier topology having a parallel resonance circuit portion.

FIG. 11 illustrates a current-mode class-D amplifier topology 1100 having a parallel resonance circuit portion 1180. This resonance circuit 1180 is arranged in parallel with L-C leg 1100. Resonance circuit 1180 facilitates conditioning and/or controlling a signal provided by topology 1100. Like other topologies described herein, topology 1100 includes several elements similar to those described in connection with topology 600 (FIG. 6). For example, topology 1100 includes an L-C leg 1110, current sources 1120 and 1122, drain-source capacitances 1130 and 1132, FETs 1140 and 1142, digital controllers 1150 and 1152, and generic current sources 1160 and 1162, which are digitally controlled by digital controllers 1150 and 1152 respectively. Once again this digital control facilitates improving amplitude modulation accuracy and ease of use.

FIG. 12 illustrates multiple CMCDs being employed in a multi-channel environment. A control computer 1210 may provide a signal to element 1220. Element 1220 may provide electronics for communicating over multiple channels with a set of CMCD. For example, element 1220 may provide separate inputs for carriers (CAR) and amplitude modulation. The components of element 1220 may be organized into pairs that are connected to a fiber transmitter 1230. The fiber transmitter 1230 may in turn be connected to a fiber receiver 1240. Recall that conventional systems experienced issue with copper cable proliferation. The fiber transmitter 1230 and receiver 1240 facilitate mitigating some of these issues.

Fiber receiver 1240 in turn is connected to a set of demodulators (e.g., 1250, 1252 . . . 1258). The demodulators may in turn be connected to a set of CMCDs (e.g., 1260, 1262 . . . 1268). The CMCDs may finally be connected to a set of coils (e.g., 1270, 1272 . . . 1274). Thus, while FIGS. 5-8 and FIG. 11 illustrated individual topologies associated with individual coils, it is to be appreciated that one example apparatus may include one or more connections to a CMCD.

Figure 13:
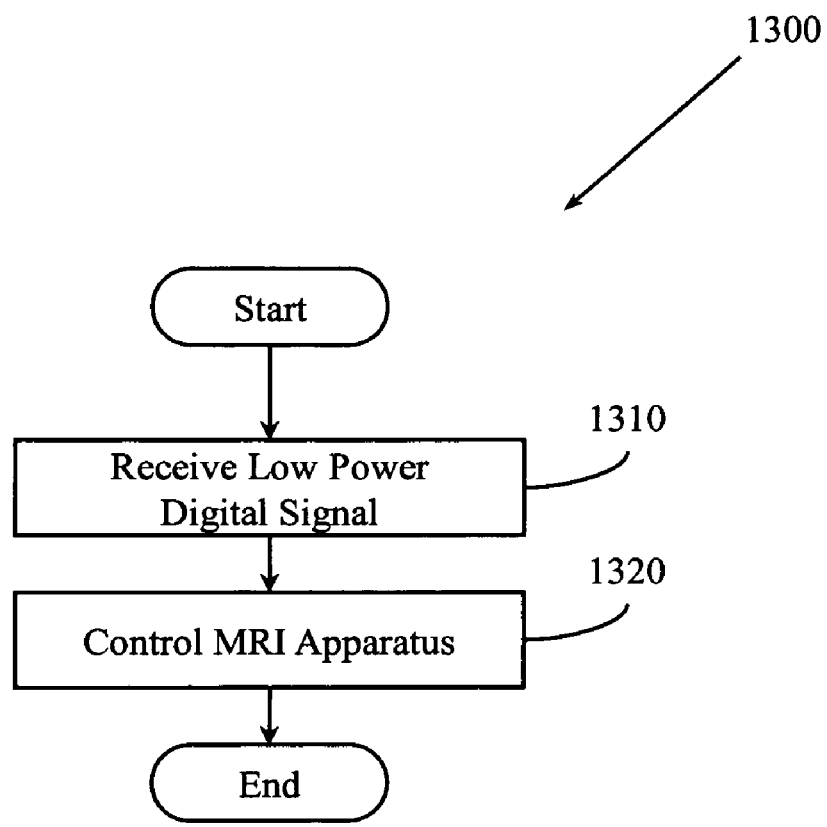
FIG. 13 illustrates a method associated with parallel transmission in magnetic resonance imaging.

FIG. 13 illustrates a method 1300 associated with parallel transmission in MRI. Method 1300 includes, at 1310, receiving a low power digital control signal associated with parallel transmission. Method 1300 may also include, at 1320, controlling an MRI apparatus to perform parallel transmission by providing an amplified analog RF signal. The amplified analog RF signal may be determined, at least in part, by the low power digital control signal. Providing the amplified analog RF signal may include providing the low power digital control signal to an on-coil current-mode amplifier that includes an LC leg. The on-coil current-mode amplifier may be, for example, a class D amplifier, a class E amplifier, and/or a class H amplifier.

In one example, the low power digital control signal may be determined from the amplified analog RF signal using sigma delta modulation, pulse width modulation, and/or pulse train optimization. Method 1300 may also include receiving a tuning signal and selectively tuning a set of surface coils associated with the MRI apparatus to different field strengths based, at least in part, on the tuning signal.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. An apparatus, comprising:
    at least two field effect transistors (FETs) connected by a coil including an LC (inductance-capacitance) leg; and a controller to input a digital control signal to the at least two FETs and to control the production of an output analog radio frequency (RF) signal, based, at least in part, on the digital signal;

where the LC leg is to selectively alter the output analog RF signal; and where the output analog RF signal is associated with parallel magnetic resonance imaging (MRI) transmission.

2. The apparatus of claim 1, including at least two drain-source capacitances in series with the coil.

3. The apparatus of claim 2, the digital control signal being determinable from the desired analog RF signal by one or more of, sigma delta modulation, pulse width modulation, and pulse train optimization.

4. The apparatus of claim 2, the digital control signal having a voltage in the range of 0.1V to 50V and the output analog RF signal having a power in the range of 1 W to 3000 W.

5. The apparatus of claim 2, including a resonance circuit arranged in parallel with the LC leg.

6. The apparatus of claim 2, where the controller is connected to the at least two FETs by a dedicated connection.

7. The apparatus of claim 6, where the dedicated connection is one of, a wireless connection and a fiber optic connection.

8. The apparatus of claim 2, where instances of the apparatus are implemented on array of surface coils.

9. The apparatus of claim 8, where the surface coils are tuneable to a desired field strength.

10. The apparatus of claim 8, where the surface coils include a shielding element.

11. The apparatus of claim 8, where the apparatus produces a power output greater than 1000 W.

12. The apparatus of claim 11, where the apparatus produces the power output with an amplifier efficiency greater than 75%.

13. The apparatus of claim 11, where the apparatus produces the power output with an upper harmonic suppression greater than 20 dB.

14. The apparatus of claim 11, where the apparatus produces the power output with isolation between adjacent, non-overlapping coils of at least 10 dB.

15. The apparatus of claim 11, where the apparatus produces the power output with isolation between adjacent, non-overlapping resonant coils of at least 6 dB.

16. A method, comprising:

receiving a low power digital control signal associated with parallel transmission in MRI; and controlling an MRI apparatus to provide an amplified analog RF signal for parallel transmission, where the analog RF signal is determined, at least in part, by the low power digital control signal, and where providing the amplified analog RF signal includes providing the low power digital control signal to an on-coil current-mode amplifier, where the coil includes an LC leg.

17. The method of claim 16, including determining the low power digital control signal from the amplified analog RF signal by one or more of, sigma delta modulation, pulse width modulation, and pulse train optimization.

18. The method of claim 17, including receiving a tuning signal and selectively tuning a set of surface coils associated with the MRI apparatus to different operating frequencies based, at least in part, on the tuning signal.

19. An apparatus for use in parallel magnetic resonance imaging (MRI) transmission, comprising:

at least two active switching elements connected by a coil including an LC (inductance-capacitance) leg;

at least two current sources; and a set of digital controllers to input a digital signal to the at least two active switching elements and to input a digital signal to the current sources, and to control the production of an output analog radio frequency (RF) signal, based, at least in part, on the digital signals;

where the LC leg is to selectively alter the output analog RF signal.

* * * * *

UNITED STATES PATENT AND TRADEMARK OFFICE
CERTIFICATE OF CORRECTION

PATENT NO. : 7,671,595 B2  Page 1 of 1
APPLICATION NO. : 12/074892
DATED : March 2, 2010
INVENTOR(S) : Griswold et al.

It is certified that error appears in the above-identified patent and that said Letters Patent is hereby corrected as shown below:

In column 5, line 38, delete "may a" and insert --may have a--.

In column 6, line 3, delete "class" and insert --a class--.

In column 7, line 51, delete "be".

In column 8, line 14, delete "issue" and insert --issues--.

Signed and Sealed this

Thirteenth Day of April, 2010

David J. Kappos
*Director of the United States Patent and Trademark Office*